US008878242B1

(12) United States Patent
Kao et al.

(10) Patent No.: US 8,878,242 B1
(45) Date of Patent: Nov. 4, 2014

(54) PICKUP DEVICE STRUCTURE WITHIN A DEVICE ISOLATION REGION

(71) Applicant: Taiwan Semiconductor Manufacturing Company, Ltd., Hsin-Chu (TW)

(72) Inventors: Min-Feng Kao, Chiayi (TW); Dun-Nian Yaung, Taipei (TW); Jen-Cheng Liu, Hsin-Chu (TW); Tzu-Hsuan Hsu, Kaohsiung (TW); Szu-Ying Chen, Toufen Township (TW); Wei-Cheng Hsu, Kaohsiung (TW); Hsiao-Hui Tseng, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/936,996

(22) Filed: Jul. 8, 2013

(51) Int. Cl.
H01L 27/146 (2006.01)

(52) U.S. Cl.
CPC ...... H01L 27/1463 (2013.01); H01L 27/14687 (2013.01)
USPC ........... 257/187; 257/291; 257/292; 257/431; 257/E27.133

(58) Field of Classification Search
CPC ................. H01L 31/02024; H01L 31/125
USPC .................. 257/458, 656, E33.046, E29.336, 257/E31.036, E31.087–E31.088, 257/E31.061–E31.062, E31.058, E31.063, 257/E31.115, E25.032, E27.133–E27.139
See application file for complete search history.

(56) References Cited

U.S. PATENT DOCUMENTS

| | | | | |
|---|---|---|---|---|
| 2005/0250240 A1* | 11/2005 | Hong et al. | ..................... | 438/57 |
| 2006/0001112 A1* | 1/2006 | Lee | ............................... | 257/412 |
| 2007/0063235 A1* | 3/2007 | Lee | ............................... | 257/292 |
| 2009/0321786 A1* | 12/2009 | Cheng et al. | .................. | 257/187 |
| 2014/0021542 A1* | 1/2014 | Cha et al. | ..................... | 257/339 |
| 2014/0054707 A1* | 2/2014 | Jou | ............................... | 257/355 |
| 2014/0061787 A1* | 3/2014 | Kim | ............................. | 257/339 |

* cited by examiner

Primary Examiner — Mamadou Diallo
(74) Attorney, Agent, or Firm — Haynes and Boone, LLP

(57) ABSTRACT

A device includes a device isolation region formed into a semiconductor substrate, the device isolation region having gaps for photo-sensitive devices, a dummy gate structure formed over the substrate, the dummy gate structure comprising at least one structure that partially surrounds a doped pickup region formed into the device isolation region, and a via connected to the doped pickup region.

20 Claims, 6 Drawing Sheets

PICKUP DEVICE STRUCTURE WITHIN A DEVICE ISOLATION REGION

BACKGROUND

Photo-sensitive devices are used in a variety of electronic devices. For example, an array of photo-sensitive devices can be used to form an image sensor array to be used in a digital camera. A photo-sensitive device typically includes an active region within a semiconductor material that transfers energy from photons into electrical energy.

Each cell within a photo-sensitive device array includes the main photo-sensitive region as well as some circuit components, such as transistors and resistors that are used to measure the electric current produced by the photo-sensitive device. It is important that these circuit components are isolated from the photo-sensitive region because stray electric current can cause dark currents within the photo-sensitive region. This adversely affects the light intensity measurements performed by the photo-sensitive region.

One way to isolate the device structures is to use shallow trench isolation. Shallow trench isolation is a common technique used in semiconductor fabrication and involves the formation of a shallow trench that is then filled with a dielectric material. This technique, however, involves plasma etching which can damage the surface of the substrate. This can adversely affect the performance of the photo-sensitive array.

Another method of isolation is a technique referred to as device isolation. This technique involves the formation of a doped semiconductor material instead of a dielectric material. The doped semiconductor material is of a different concentration than the doping concentration of adjacent semiconductor materials, thus forming a junction. However, this technique is less effective when isolating heavily doped regions used for circuitry that is adjacent to the photo-sensitive devices. Thus, it is desirable to find a method of isolation that effectively protects the photo-sensitive devices without causing damage to the surface of the substrate.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Figure 1:
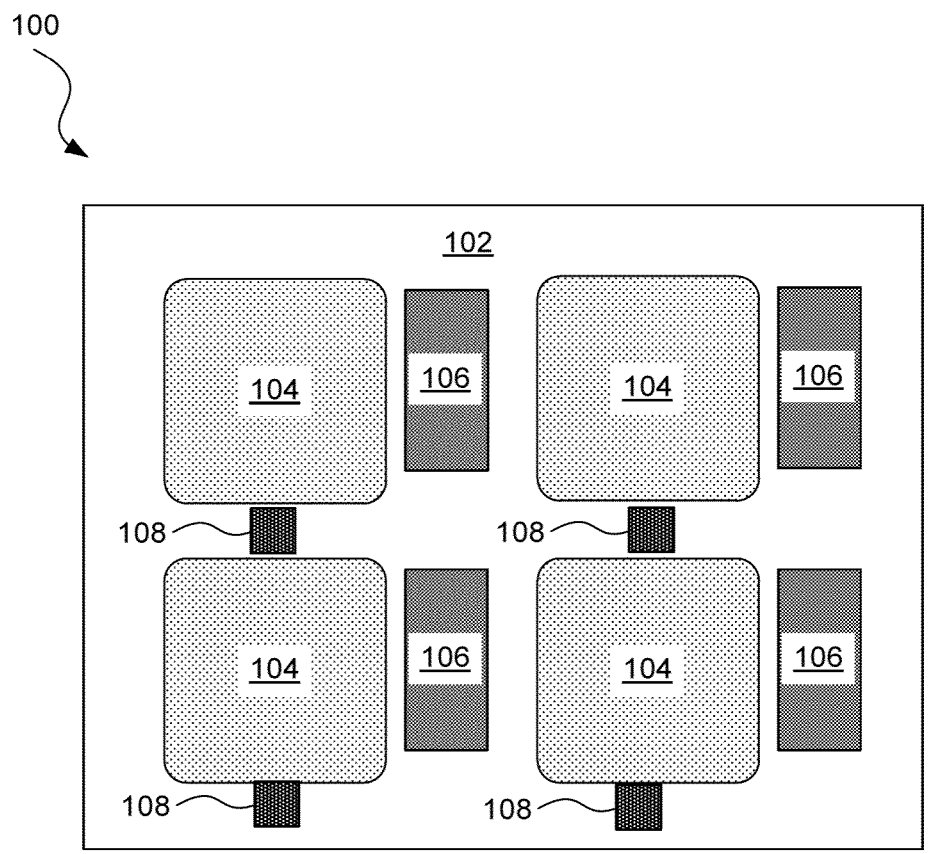
FIG. 1 is a diagram showing an illustrative top view of an array of photo-sensitive devices, according to one example of principles described herein.

FIG. 1 is a diagram showing an illustrative top view of an array 100 of photo-sensitive devices. According to the present example, the photo-sensitive array 100 includes a number of photo-sensitive devices such as photodiodes. Each photo-sensitive device 104 is associated with a set of circuitry 106. Additionally, the array 100 may include a number of pickup devices 108. The pickup devices 108 are used to bias the device isolation regions, as will be described in further detail below.

Photodiodes 104 are commonly used in image sensor arrays to measure the intensity of light. Photodiodes 104 are often formed through use of a P-I-N junction. Such a junction includes an intrinsic semiconductor region between a p-type doped region and an n-type doped region. During operations, a reverse bias is typically applied to the photodiode 104. A reverse bias is where the p-type doped region is connected to a negative terminal and a positive terminal is connected to the n-type region. Under such conditions, the photodiode 104 can be used to create either an electric current or a voltage. The strength of the electric current or voltage is based on the intensity of light impinging on the active region of the photodiode 104.

To appropriately bias the photodiode 104 and measure any electric current or voltage being created by the photodiode in response to impinging photons, circuitry 106 is formed onto the substrate 102 adjacent to each photodiode 104. The circuitry includes a variety of components including resistors and switching devices such as Metal Oxide Semiconductor Field Effect Transistors (MOSFETs). Specifically, the circuitry may include a reset transistor, a transfer transistor, a source follower transistor, and a row select transistor. Such switching devices also allow for addressing a specific photodiode 104 within the array 100.

The electric current flowing through the switches and other circuitry 106 associated with each photodiode 104 can cause issues if that current leaks into the active region of the photodiode 104. Thus, it is important that the circuitry 106 is effectively isolated from the active region of the photodiode 104. Additionally, it is important that the doped regions within the pickup devices are effectively isolated so that electric current does not flow into the active regions of the photodiodes 104.

Isolation is often done using shallow trench isolation (STI), which is the formation of a dielectric material into the semiconductor substrate adjacent to the circuitry to be isolated. However, the formation of shallow trench isolation structures involves plasma etching. This plasma etching process can have adverse effects on the surface of the substrate. Such adverse effects may impair the performance of the array 100.

Another isolation technique is referred to as device isolation. Device isolation works by doping regions of a semiconductor substrate to define a device rather than etching a trench and forming a dielectric material in that trench. The doped region effectively creates a junction with the bulk substrate material and prevents electrons from straying through. When forming the doped regions of a pickup device 108, the ion implantation doping process can result in a doped region that is too large and extends too close to a photodiode 104. This can have an adverse effect on a nearby photodiode 104. Specifically it may cause dark current and white pixel effects which will create errors in the measurement of light impinging on the photodiode 104.

Pickup devices 108 may be used to connect the device isolation regions to a voltage source. Application of a voltage to the device isolation region can bias the device isolation region as desired. Biasing a device isolation region can allow the isolation to better isolate a particular device. In some cases, the entire substrate may be doped to form a large device isolation region. The only regions that are not doped and thus not part of the device isolation region are where the photodiodes 104 are to be formed and where the circuitry 106 associated with those photodiodes 104 are formed. Thus, the substrate may include a number of pickup devices 108 positioned throughout the array. Each pickup device 108 connects to a voltage source that is used to bias the device isolation region.

The pickup devices 108 serve as a connection between the device isolation region and a metal via that is used to connect the device isolation to a voltage source. It is generally not preferable to directly connect the metal via to the device isolation region. A better connection is made if a highly doped region is formed into the device isolation region where the via is to be placed.

Because the space between photodiodes 104 is relatively small, the pickup devices 108 may have to be positioned between photodiodes 104 and will thus be relatively close to the photodiodes 104. Thus, the ion implantation doping process used to form the highly doped region into the device isolation region may create a doped region that is too large and extends beyond the device isolation region and come close or stray into a photodiode region. As mentioned above, this creates adverse effects such as dark current and white pixel effects. Thus, according to principles described herein, a gate-like structure is formed to partially encompass the region where the highly doped region is to be formed and thus limit the size of the highly doped region appropriately.

FIGS. 2A-2D are diagrams showing top and side views of a process for forming a pickup structure separated from photo-sensitive devices by device isolation. The left side of each figure illustrates a top view 202. The right side of each figure illustrates a cross-sectional view 204. The precise cross-section that is viewed is illustrated by the dotted line 220 shown with the top view 202.

Figure 2A:
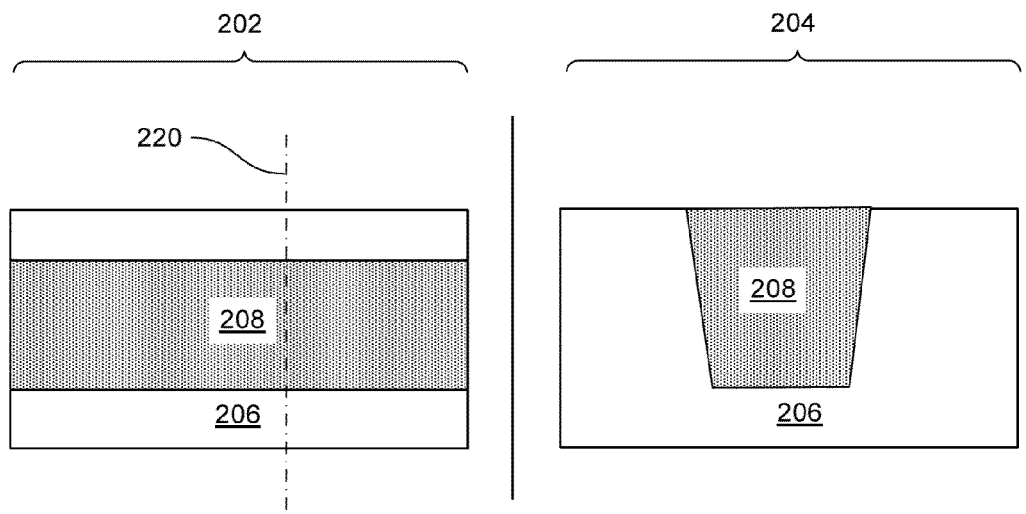
FIGS. 2A-2D are diagrams showing top and side views of a process for forming a pickup structure separated from photo-sensitive devices by device isolation, according to one example of principles described herein.

FIG. 2A illustrates the formation of the device isolation region 208 into the substrate 206. The substrate 206 may be made of a semiconductor material such as silicon. In some cases, the device isolation region 208 may exist everywhere except for where components are to be formed. For example, the device isolation region 208 may be formed everywhere except for where the photodiodes are placed and the circuitry associated with those photodiodes.

As mentioned above, device isolation involves a doping of the semiconductor substrate 206. In some cases, the substrate 206 itself may be doped in a particular manner. In such cases, the device isolation region may have the same type of doping but have a much higher concentration of doping in order to create the junction. Various different device isolation techniques may be used in accordance with principles described herein.

The center portion of the top view 202 illustrates a region where the substrate is doped to form the device isolation region. The device isolation region 208 may include gaps where photodiodes can be formed. In the cross-sectional view 204, the middle region illustrates the device isolation region. Specifically, the middle region illustrates where the pickup device is to be formed.

Figure 2B:
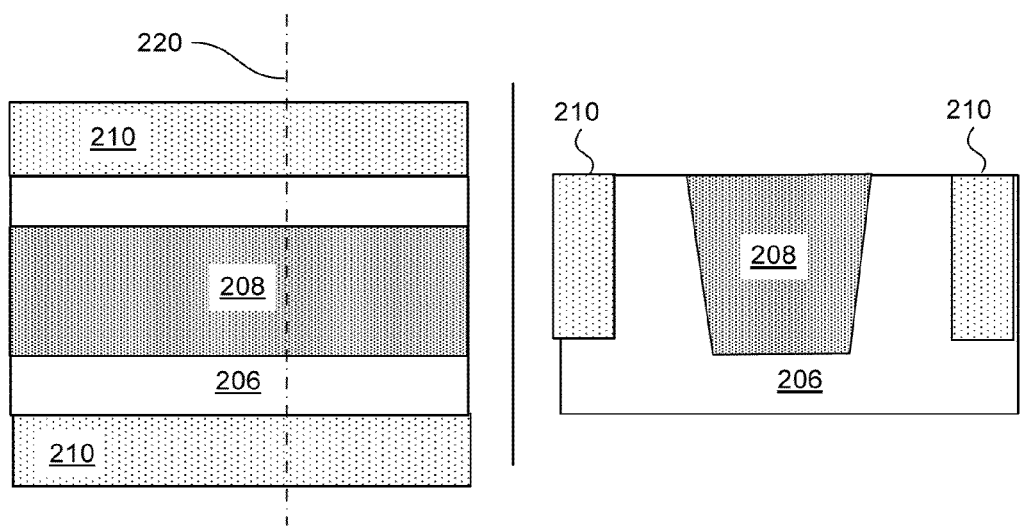

FIG. 2B is a diagram showing the illustrative formation of photodiodes 210 adjacent to the region where the pickup device is to be placed. It is typically desirable to have an array with the photodiodes 210 as close to each other as possible in order to obtain a high resolution image. Thus, the pickup devices are often formed directly between two adjacent photodiodes 210.

Figure 2C:
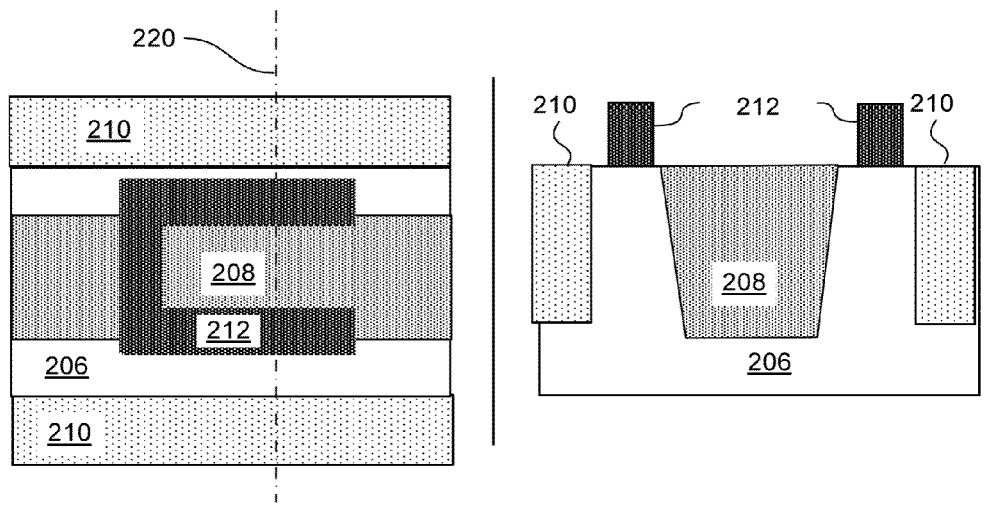

FIG. 2C illustrates the formation of a dummy gate structure 212. Gate structures are often used to form gate terminals for a transistor. The gate terminal is a conductive material that is formed between a source region and a drain region. The source and drain regions are typically doped semiconductor regions formed at opposing ends of the gate structure. A transistor works by either allowing or blocking current to flow between the source terminal and the drain terminal. Depending on the type of transistor, either a high or low signal will put the transistor into an ON state, where electric current can flow between the source and drain terminal. Conversely, an opposing signal applied at the gate will put the transistor into an OFF state, where electric current is prevented from flowing between the source terminal and the drain terminal.

The dummy gate structure 212 may be formed using the same mask used to form the gate devices in the transistors of the circuitry associated with each photodiode. Thus, the dummy gate structure 212 that partially encompasses the region where the doped pickup region is to be formed, is formed at the same time, using the same processes, as the other gate structures. The dummy gate structure 212 is referred to as a "dummy" gate structure because it does not perform the standard gate function, although it is made from the same material and same process.

The top view 202 illustrates a dummy gate structure 212 as a U-shaped structure with the open portion of the U-shape pointing in a direction that runs parallel to the photodiodes 210. The cross-sectional view 204 illustrates the two extensions of the U-shaped dummy gate structure 212. As illustrated, the two extensions can block an ion implantation doping process that is used to form the pickup region. Thus, the pickup region is prevented from being so large that it extends too close to the photodiodes 210. As will be described in further detail below, other shapes for gate structures 212 may be used in accordance with principles described herein. For example, the U-shaped dummy gate structure may be oriented differently. In some cases, multiple dummy gate structures 212 may be used to fully encompass the pickup region except for small gaps.

The dummy gate structure 212 may be made of polysilicon. Polysilicon is a type of silicon that can conduct electric current and is thus suitable for a real gate structure to be used for transistors. To make the process of forming the dummy gate structures 212 more efficient, they are also made from the same material. The dummy gate structures 212, however, are not used not function as a gate device. The thickness of the dummy gate structure 212 may be based on design purposes. Specifically, the thickness of the dummy gate structure 212 may be such that the pickup regions to be formed are effectively confined within the intended area and do not extend too close to the photodiodes 210.

Figure 2D:
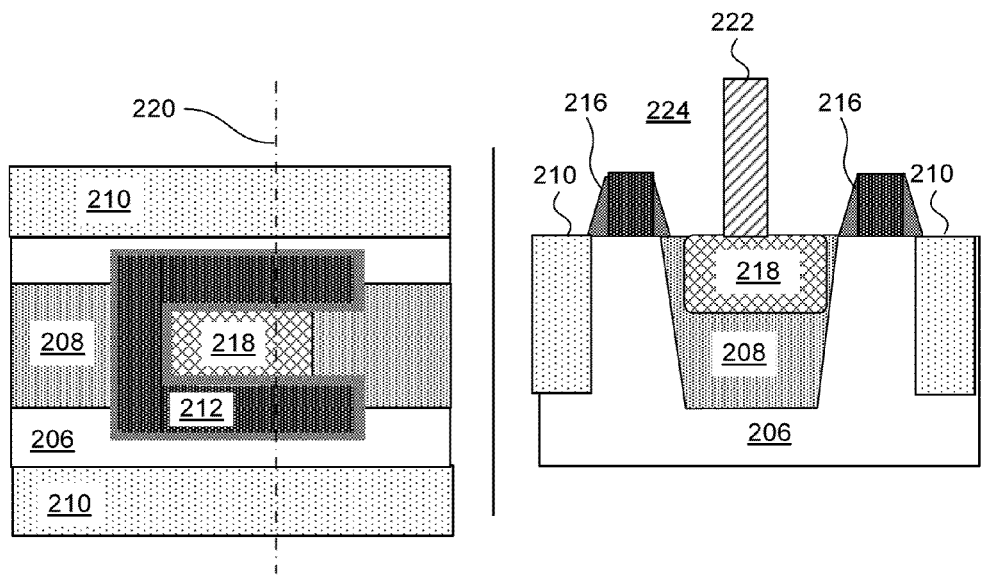

FIG. 2D is a diagram illustrating the formation of sidewall spacers 216 on the gate structure 212 and formation of the pickup region 218. Sidewall spacers 216 may be made of a variety of materials including silicon oxide or silicon nitride. Sidewall spacers 216 are commonly used in semiconductor fabrication processes. Sidewall spacers 216 are used to give some space between the gate structure 212 and the formation of a doped regions. In the case of transistors, adjacent doped regions may be source/drain regions. Here, in the case of a pickup device, the adjacent doped regions are the doped pickup regions.

After the sidewall spacers 216 have been formed, the ion implantation doping process can occur. This forms the pickup region 218 in the desired location that is partially enclosed by the U-shaped dummy gate structure 212. The dummy gate structure 212 blocks the ion implantation doping process so that the highly doped pickup region is limited as desired. While ion implantation is a relatively controlled process, it is not completely precise. Thus, by blocking the surrounding area with the dummy gate structure 212, the risk of performing the ion implantation process in an undesired location is reduced. Specifically, the pickup region is prevented from being formed so large so as to be formed too close to the photodiodes 210.

The top view 202 illustrates the formation of the pickup region 218 within the dummy gate structure. Because the dummy gate structure 218 partially encompasses the region where the pickup region is formed, the pickup region 218 is limited in size. This prevents the pickup region from being larger than intended and extending into the photodiodes 210.

The cross-sectional view 204 illustrates the formation of the pickup region 218 between the two extensions of the U-shaped dummy gate structure 214. As illustrated, the sidewall spacer 216 displaces the source/drain region 218 from being directly adjacent to the extensions of the dummy gate structure 212.

In some cases, a lightly doped region, which is often referred to as LDD, can be formed before sidewall spacers 216 are put into place. For example, an LDD doping process is performed before the sidewall spacers are formed. The LDD process forms a doped region having a lower doping concentration than the final pickup region to be formed. Then, after the sidewall spacers have been formed, the main doping process that forms the doped pickup region 218 is performed.

The cross-sectional view 204 also illustrates the formation of a via 222. In some cases, the via 222 is formed after an interlayer dielectric material 224 is formed over the layer of the dummy gate structure 212. The interlayer dielectric layer effectively isolates the components of various layers from each other. Vias 222 are typically formed by etching a hole into the interlayer dielectric layer 224 down to the underlying layer. In this case, the hole is formed down to the pickup region 218. Then, the hole is filled with a conductive material such as a metal material. The via 222 ultimately connects the pickup region to a voltage source. The voltage source is then used to bias the device isolation region as desired.

In some cases, a via may connect to the dummy gate structure 212. This allows the dummy gate structure to be biased as well. The dummy gate structure may be biased for various reasons to aid in the operation of circuitry within the photo-sensitive array.

Figure 3A:
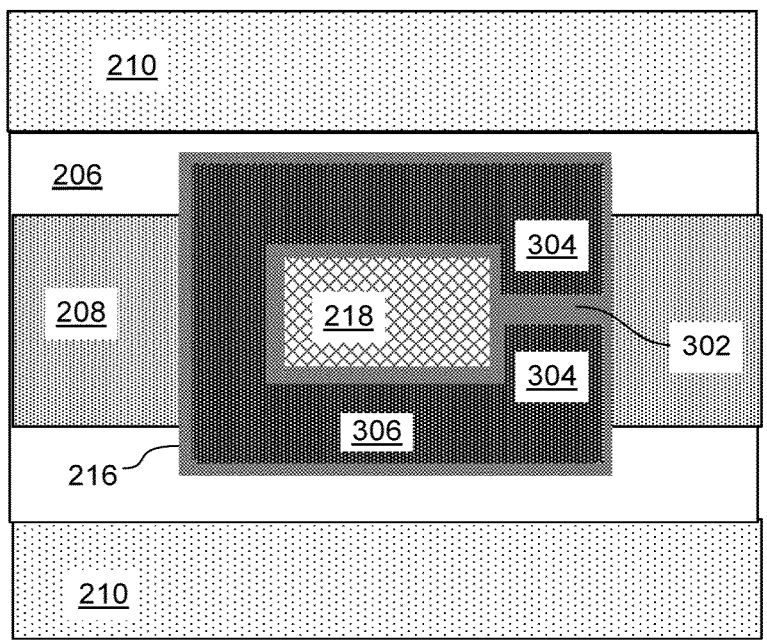
FIG. 3A is a diagram showing an illustrative C-shaped gate structure with a small gap, according to one example of principles described herein.

FIG. 3A is a diagram showing an illustrative C-shaped gate structure 306 with a small gap 302. According to the present example, the C-shaped gate structure 306 is similar to the U-shaped gate structure (e.g., 212, FIG. 2). The C-shaped gate structure 306 includes further extensions 304 that point towards each other such that a small gap 302 is formed. Thus, the pickup region 218 is fully enclosed except for a small gap 304. Thus, the formation of the pickup region 218 is further limited. This can help reduce the chances that electric current flowing through the pickup region 218 will leak through the device isolation region into the photodiodes 210.

The gap 304 may be one of a variety of thicknesses. In one example, the thickness of the gap 204 is twice the thickness of the sidewall spacers 216. Thus, the sidewall spacers 216 will effectively fill in the gap 304 and the pickup region 218 will be completely encompassed. The ion implantation doping process will thus be further limited and the pickup region 218 will be kept to its desired size.

Figure 3B:
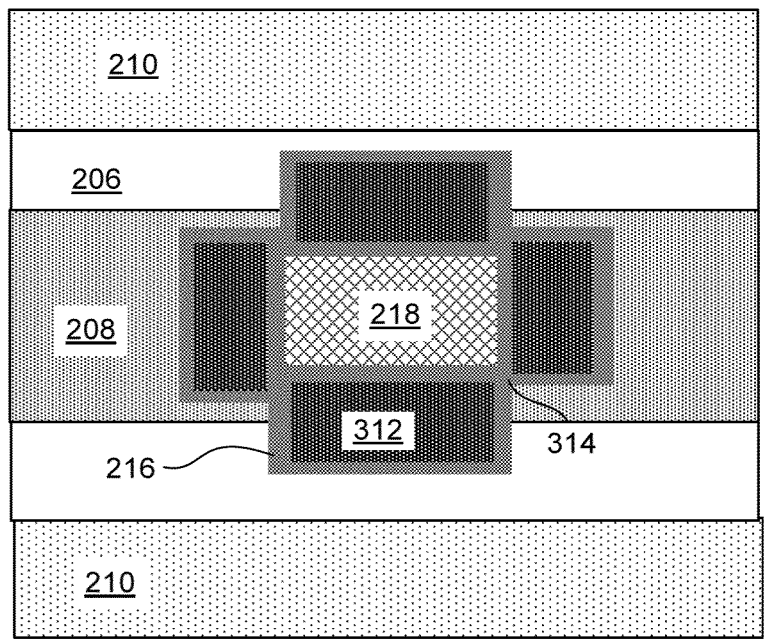
FIG. 3B is a diagram showing an illustrative gate structure that includes four separate elongated structures, according to one example of principles described herein.

FIG. 3B is a diagram showing an illustrative gate structure that includes four separate elongated structures. According to the present example, the four elongated dummy gate structures 312 form a square shape around the pickup region. Thus, there are four gaps 314. In this example, the gaps 314 are small enough so that the sidewall spacers 216 fill in the gaps 314. In some examples, the different elongated dummy gate structures 312 may be of different lengths. For example, the four elongated dummy structures 312 may form a rectangular shape.

Figure 3C:
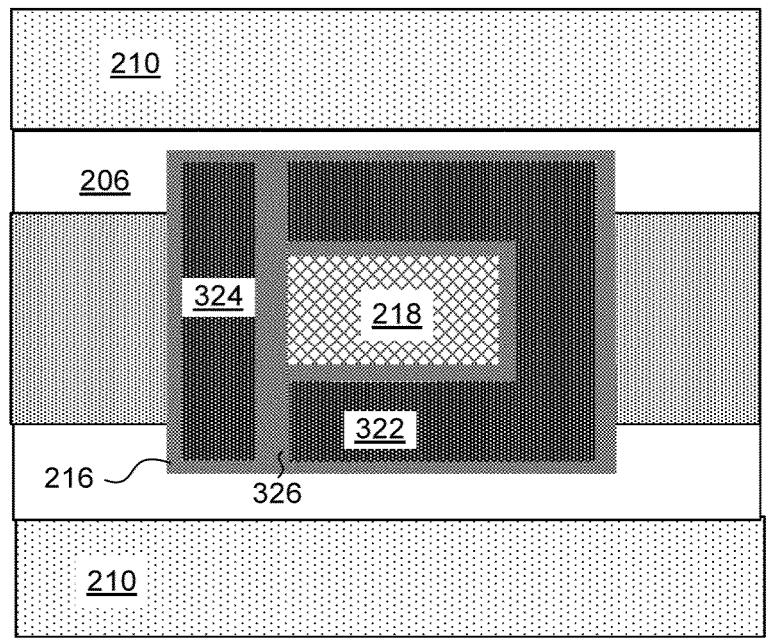
FIG. 3C is a diagram showing an illustrative gate structure that includes a U-shaped structure and an elongated structure, according to one example of principles described herein.

FIG. 3C is a diagram showing an illustrative gate structure that includes a U-shaped dummy gate structure 322 and an elongated dummy gate structure 324. According to the present example, the elongated dummy gate structure 324 is formed perpendicular to the open direction of the U-shaped dummy gate structure 322. Such a formation leaves two small gaps 326. In this example, the gaps 326 are small enough so that the sidewall spacers 216 fill in the gaps 326.

Figure 3D:
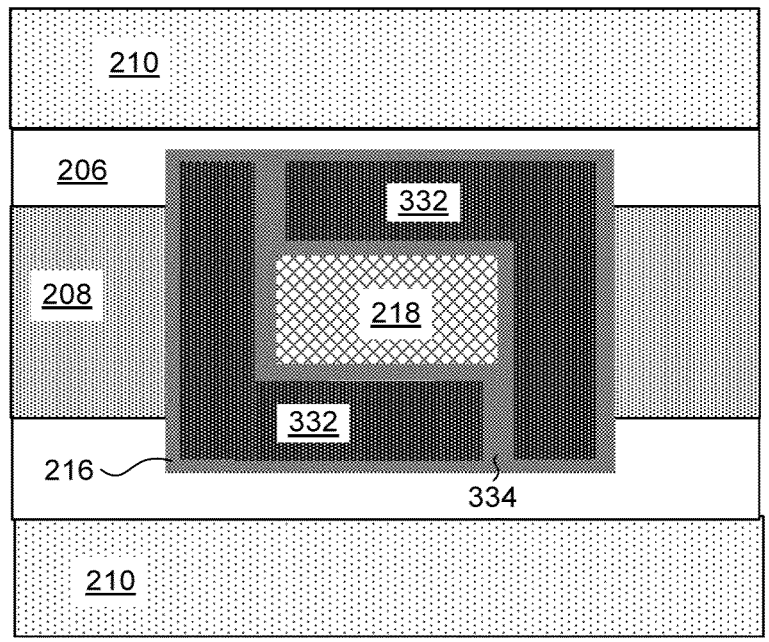
FIG. 3D is a diagram showing an illustrative gate structure that includes two L-shaped structure, according to one example of principles described herein.

FIG. 3D is a diagram showing an illustrative gate structure that includes two L-shaped dummy gate structures 332. According to the present example, the two L-shaped dummy structures 332 are formed with the open ends facing each other to encompass the pickup region 218. The position of the L-shaped structures also leaves two gaps 334. In this example, the gaps 334 are small enough so that the sidewall spacers 216 fill in the gaps 334.

The examples of dummy gate structure shapes as shown in FIG. 2 and FIGS. 3A-3D are not an exhaustive list of possible shapes. Various other shaped dummy gate structures may be formed to partially encompass the pickup regions.

Figure 4:
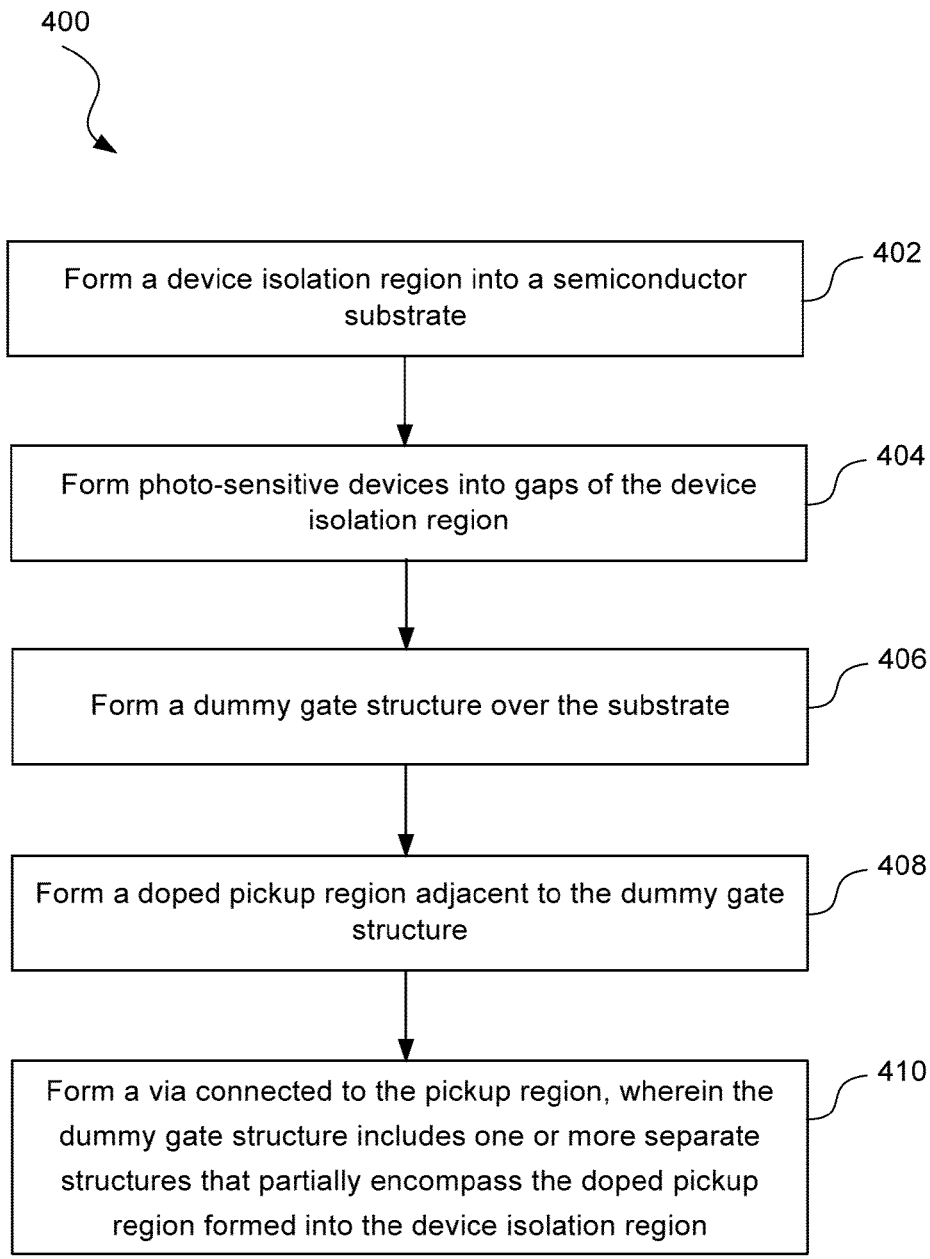
FIG. 4 is a flowchart showing an illustrative method for forming a pickup structure separated by device isolation, according to one example of principles described herein.

FIG. 4 is a flowchart showing an illustrative method for forming a pickup structure separated by device isolation. According to certain illustrative examples, the method includes a step for forming 402 device isolation regions into a semiconductor substrate. The method further includes a step for forming 404 photo-sensitive devices into gaps of the device isolation regions. The method further includes a step for forming 406 a dummy gate structure over the substrate. The method further includes a step for forming 408 a doped pickup region adjacent to the dummy gate structure. The method further includes a step for forming 410 a via connected to the pickup region. The dummy gate structure includes one or more separate structures that partially encompass the doped pickup region formed into the device isolation material.

According to certain illustrative examples, a device isolation region formed into a semiconductor substrate, the device isolation region having gaps for photo-sensitive devices, a dummy gate structure formed over the substrate, the dummy gate structure comprising at least one structure that partially surrounds a doped pickup region formed into the device isolation region, and a via connected to the doped pickup region.

According to certain illustrative examples, a method for forming a transistor device to be used in association with a photo-sensitive device includes forming a device isolation region into a semiconductor substrate, forming photo-sensitive devices into gaps of the device isolation region, forming a dummy gate structure over the substrate, forming a doped pickup region adjacent to the dummy gate structure, and forming a via connected to the pickup region. The dummy gate structure includes one or more separate structures that partially encompass the doped pickup region formed into the device isolation region.

According to certain illustrative examples, a pickup device within an array of photo-sensitive devices includes a device isolation region formed into a semiconductor substrate, photo-sensitive devices being isolated by the device isolation region, a doped pickup region formed into the device isolation region, the doped pickup region being doped with a same type of material as the device isolation and having a higher doping concentration than the device isolation region, a polysilicon dummy gate structure formed over the substrate, the dummy gate structure comprising at least one elongated structure that partially surrounds a doped pickup region formed into the device isolation region, and a via connected to the pickup region.

It is understood that various different combinations of the above-listed embodiments and steps can be used in various sequences or in parallel, and there is no particular step that is critical or required. Additionally, although the term "electrode" is used herein, it will be recognized that the term includes the concept of an "electrode contact." Furthermore, features illustrated and discussed above with respect to some embodiments can be combined with features illustrated and discussed above with respect to other embodiments. Accordingly, all such modifications are intended to be included within the scope of this invention.

The foregoing has outlined features of several embodiments. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions and alterations herein without departing from the spirit and scope of the present disclosure.

What is claimed is:

1. A device comprising:
   a device isolation region formed into a semiconductor substrate, the device isolation region having gaps;
   one or more photo-sensitive devices in the gaps;
   a dummy gate structure formed over the substrate;
   a doped pickup region formed into the device isolation region, wherein the dummy gate structure includes at least one structure that partially surrounds the doped pickup region; and
   a via connected to the doped pickup region.

2. The device of claim 1, wherein the dummy gate structure is adjacent to a gap having a photo-sensitive device formed therein.

3. The device of claim 1, wherein the dummy gate structure forms a C-shape.

4. The device of claim 3, wherein the gap in the C-shape dummy gate structure is twice the thickness of a spacer material formed on the walls of the dummy structure.

5. The device of claim 1, wherein the dummy gate structure forms a U-shape with an open end of the U-shape not facing towards a photo-sensitive device adjacent to the dummy gate structure.

6. The device of claim 1, wherein the dummy gate structure comprises four elongated structures that surround the doped pickup region leaving four gaps.

7. The device of claim 1, further comprising a sidewall spacer formed on the walls of the dummy gate structure.

8. The device of claim 1, wherein the pickup region is doped with the same type of dopant as the device isolation region and has a higher doping concentration than the device isolation region.

9. The device of claim 8, wherein the dummy gate structure is biased.

10. The device of claim 1, wherein the dummy gate structure is made of polysilicon.

11. A method for forming a transistor device to be used in association with a photo-sensitive device, the method comprising:
    forming a device isolation region into a semiconductor substrate;
    forming photo-sensitive devices into gaps of the device isolation region;
    forming a dummy gate structure over the substrate;
    forming a doped pickup region adjacent to the dummy gate structure; and
    forming a via connected to the pickup region;
    wherein, the dummy gate structure includes one or more separate structures that partially encompass the doped pickup region formed into the device isolation region.

12. The method of claim 11, wherein the dummy gate structure forms a C-shape.

13. The method of claim 12, wherein the gap in the C-shape dummy gate structure is twice the thickness of a spacer material formed on the walls of the dummy gate structure.

14. The method of claim 11, wherein the dummy gate structure forms a U-shape with an open end of the U-shape not facing towards a photo-sensitive device adjacent to the dummy gate structure.

15. The method of claim 11, wherein the dummy gate structure comprises four elongated structures that surround the pickup region leaving four gaps.

16. The method of claim 11, wherein the dummy gate structure comprises two L-shaped structures with two small gaps, the gaps having a width that is about twice the a thickness of a spacer material formed on walls of the dummy gate structure.

17. The method of claim 11, wherein the pickup region is doped with the same type of dopant as the device isolation region and has a higher doping concentration than the device isolation region.

18. The device of claim 8, wherein the dummy gate structure is biased.

19. The device of claim 1, wherein the dummy gate structure is made of polysilicon.

20. A pickup device within an array of photo-sensitive devices, the device comprising:
- a device isolation region formed into a semiconductor substrate;
- photo-sensitive devices being isolated by the device isolation region;
- a doped pickup region formed into the device isolation region, the doped pickup region being doped with a same type of material as the device isolation and having a higher doping concentration than the device isolation region;
- a polysilicon dummy gate structure formed over the substrate, the dummy gate structure comprising an elongated structure that at least partially surrounds the doped pickup region formed into the device isolation region; and
- a via connected to the pickup region.

* * * * *